US 011575373B2

(12) United States Patent
Campbell (10) Patent No.: US 11,575,373 B2
(45) Date of Patent: Feb. 7, 2023

(54) SWITCH CIRCUITRY (71) Applicant: Qorvo US, Inc., Greensboro, NC (US)

(72) Inventor: Charles Forrest Campbell, Dallas, TX (US)

(73) Assignee: Qorvo US, Inc., Greensboro, NC (US)

( * ) Notice: Subject to any disclaimer, the term of this patent is extended or adjusted under 35 U.S.C. 154(b) by 48 days.

(21) Appl. No.: 16/213,185

(22) Filed: Dec. 7, 2018

(65) Prior Publication Data
US 2020/0127658 A1 Apr. 23, 2020

Related U.S. Application Data (60) Provisional application No. 62/747,194, filed on Oct. 18, 2018.

(51) Int. Cl.
*H03K 17/16* (2006.01)
(52) U.S. Cl.
CPC .................. *H03K 17/161* (2013.01)
(58) Field of Classification Search
CPC .............. H03K 17/161; H03K 17/693; H03K 17/102
See application file for complete search history.

(56) References Cited

U.S. PATENT DOCUMENTS

| | | | |
|---|---|---|---|
| 6,066,974 A | 5/2000 | Lin et al. | |
| 7,755,222 B2 | 7/2010 | Heston et al. | |
| 8,054,143 B2 * | 11/2011 | Takahashi | H03K 17/693 333/103 |
| 8,324,959 B2 | 12/2012 | Masumoto | |

(Continued)

FOREIGN PATENT DOCUMENTS

| | | |
|---|---|---|
| EP | 1451890 B1 | 2/2011 |
| JP | S5588544 U | 7/1980 |

(Continued)

OTHER PUBLICATIONS

Campbell, Charles, "Method to Reduce Control Voltage for High Power GaN RF Switches," MTT-S International Microwave Symposium, Phoenix, Arizona, May 17-22, 2015, IEEE, 4 pages.

(Continued)

*Primary Examiner* — Ryan Johnson
*Assistant Examiner* — Colleen J O Toole
(74) *Attorney, Agent, or Firm* — Withrow & Terranova, P.L.L.C.

(57) ABSTRACT

Switch circuitry is disclosed having a series stack of transistors coupled between first and second port terminals. A string of gate resistors having a common gate terminal is coupled to gates of the series stack of transistors. A bias control transistor has a bias control terminal and first and second current terminals. The second control terminal is coupled to a switch control terminal configured to receive on-state and off-state control voltages that transition the series stack of transistors between passing a radio frequency signal and blocking the radio frequency signal from passing between the first and second port terminals, respectively. A string of diodes is coupled between the common gate terminal and the first current terminal, and a common gate resistor is coupled between the common gate terminal and the switch control terminal. The diodes contribute to actively generating additional negative gate bias as RF power level increases.

16 Claims, 6 Drawing Sheets

(56) References Cited

U.S. PATENT DOCUMENTS

| | | | |
|---|---|---|---|
| 8,923,782 B1 | 12/2014 | Ravindran et al. | |
| 9,768,770 B2 | 9/2017 | Campbell | |
| 10,153,306 B2* | 12/2018 | Lee | H01L 27/1259 |
| 2005/0179506 A1 | 8/2005 | Takahashi et al. | |
| 2007/0159230 A1 | 7/2007 | Heston et al. | |
| 2010/0013571 A1 | 1/2010 | Arell et al. | |
| 2012/0313709 A1 | 12/2012 | Lautzenhiser | |
| 2014/0009214 A1 | 1/2014 | Altunkilic et al. | |
| 2014/0043110 A1 | 2/2014 | Kobori et al. | |
| 2015/0256172 A1 | 9/2015 | Campbell | |
| 2017/0201248 A1* | 7/2017 | Scott | H03K 17/145 |

FOREIGN PATENT DOCUMENTS

| | | |
|---|---|---|
| JP | 05-336732 A | 12/1993 |
| JP | 2008-017416 A | 1/2008 |
| JP | 2011-188102 A | 9/2011 |
| WO | 2007081973 A2 | 7/2007 |
| WO | 2007018037 A1 | 2/2009 |

OTHER PUBLICATIONS

Non-Final Office Action for U.S. Appl. No. 14/196,987, dated Aug. 25, 2016, 13 page.

Final Office Action for U.S. Appl. No. 14/196,987, dated Mar. 7, 2017, 10 pages.

Notification of Reasons for Refusal for Japanese Patent Application No. 2015-041269, dated Feb. 26, 2019, 8 pages.

Official Letter for Taiwanese Patent Application No. 104106615, dated Jan. 8, 2019, 7 pages.

Decision to Grant for Japanese Patent Application No. 2015-041269, dated Oct. 23, 2019, 5 pages.

* cited by examiner

SWITCH CIRCUITRY

RELATED APPLICATIONS

This application claims the benefit of provisional patent application Ser. No. 62/747,194, filed Oct. 18, 2018, the disclosure of which is hereby incorporated herein by reference in its entirety.

FIELD OF THE DISCLOSURE

Embodiments of the present disclosure relate generally to the field of circuits and more particularly to a bias circuit for a radio frequency switching device.

BACKGROUND

Radio frequency (RF) switching devices are used in many applications, such as in wireless communication systems, to selectively pass an RF signal. Many switching devices include a series stack of field-effect transistors (FETs) to switch the RF signal. However, undesirably low levels of bias voltage applied to the gates of the FETs can cause insertion loss and/or cause undesirable switching effects. These undesirable effects cause reduced power handling by the switching device. Therefore, a new switch architecture that increases power handling by mitigating insertion loss and undesired switching of the FETs is needed.

SUMMARY

Switch circuitry that includes a series stack of an N number of transistors with increased power handling is disclosed. In an exemplary embodiment, an Nth one of the N number of transistors has a drain terminal coupled to a first port terminal and a first one of the N number of transistors has a source terminal coupled to a second port terminal such that a radio frequency signal is passed between the first port terminal and the second port terminal when an on-state control voltage is applied to gate terminals of the N number of transistors. In contrast, the radio frequency signal is blocked from passing between the first port terminal and the second port terminal when an off-state control voltage is applied to the gate terminals. A series string of an N−1 number of gate resistors having a common gate terminal is also included. Each of the N−1 number of gate resistors is coupled between the gate terminals of adjacent ones of the N number of transistors. Further included is a bias control transistor having a bias control terminal, a first current terminal, and a second current terminal coupled to a switch control terminal configured to receive the on-state control voltage and the off-state control voltage. A common gate resistor is coupled between the common gate terminal and the switch control terminal. The common gate resistor conveys the on-state and off-state voltages to the gate terminals of the N number of transistors.

An M number of diodes are arranged and coupled between the common gate terminal and the first current terminal to rectify the RF signal and thereby apply additional voltage to the gate terminals, where M is a positive integer greater than zero. In particular, the M number of diodes along with FET gate-drain capacitances, the N−1 number of gate resistors, and the common gate resistor form a diode clamping circuit that actively generates additional negative gate bias voltages as the RF power level of the RF signal is increased.

In at least some embodiments, individual ones of N−1 feedback capacitors are coupled between a drain and a gate of each of the N number of transistors with the exception of the Nth one of the N number of transistors. Also, in at least some embodiments, device periphery of individual ones of the N number of transistors is scaled to a fraction of the Nth one of the N number of transistors.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure and, together with the description, serve to explain the principles of the disclosure.

DETAILED DESCRIPTION

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

Figure 1:
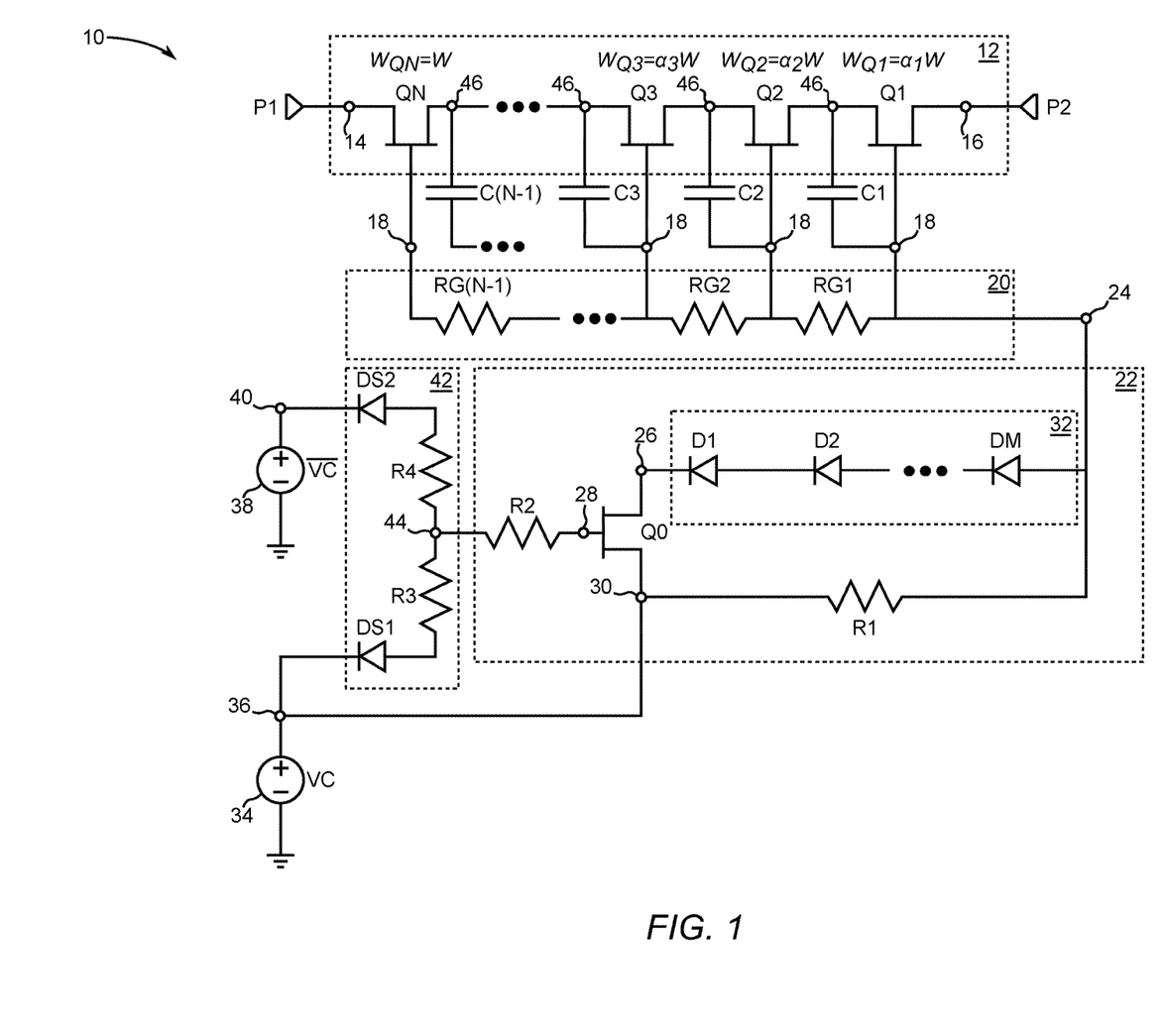
FIG. 1 is a schematic of switch circuitry that includes a series stack of an N number of transistors that are provided with increased power handling in accordance with the present disclosure.

FIG. 1 is a schematic of a general embodiment of switch circuitry 10 that includes a series stack of an N number of transistors 12 that are provided with increased power handling in accordance with the present disclosure. The series string of the N number of transistors 12 is made up of a first field-effect transistor (FET) Q1, a second FET Q2, a third FET Q3, and an Nth FET QN, where N is a positive integer greater than 1. In some embodiments, the series string of the N number of transistors 12 is made up of gallium nitride FETs. In other embodiments the series string of the N number of transistors 12 is made up of gallium arsenide FETs. Moreover, in some embodiments, the series string of the N number of transistors 12 is made up of silicon-on-insulator FETs.

In the general embodiment of FIG. 1, the Nth FET QN has a drain terminal 14 coupled to a first port terminal P1, and the first FET Q1 has a source terminal 16 coupled to a second port terminal P2 such that a radio frequency signal is passed between the first port terminal P1 and the second port terminal P2 when an on-state control voltage is applied to gate terminals 18 of the N number of transistors 12. In contrast, the radio frequency signal is blocked from passing between the first port terminal P1 and the second port terminal P2 when an off-state control voltage is applied to the gate terminals 18.

Also included is a series string of an N−1 number of gate resistors 20 made up of a first gate resistor RG1, a second gate resistor RG2, and a last gate resistor RG(N−1). Each of the N−1 number of gate resistors 20 is coupled between the gate terminals 18 of adjacent ones of the N number of transistors 12. For example, the first gate resistor RG1 is coupled between the gate terminals 18 of the adjacent FETs Q1 and Q2, and the second gate resistor RG2 is coupled between the gate terminals 18 of adjacent FETs Q2 and Q3. Each of the N−1 number of gate resistors 20 has a resistance value that is between six and nine orders of magnitude greater than an input impedance value of individual ones of the N−1 number of gate resistors.

The switch circuitry 10 further includes a bias circuit 22 that is configured to provide a bias voltage at a gate terminal 24 that couples the bias circuit 22 to the N−1 number of gate resistors 20. The bias circuit 22 includes a bias control transistor Q0 having a first current terminal 26, a bias gate terminal 28, and a second current terminal 30. A series string of diodes 32 is coupled between the gate terminal 24 and the first current terminal 26 of the bias transistor Q0. In the general embodiment depicted in FIG. 1, the series string of an M number of bias diodes 32 is made of a first diode D1, a second diode D2, and an Mth diode DM, wherein M is a positive integer greater than zero. The number M may be less than, equal to, or greater than the number N depending upon the maximum bias voltage expected at the gate terminal 24 with respect to ground. The bias circuit 22 further includes a bias resistor R1 that may also be considered a common resistor for the series string of gate resistors 20. The bias resistor R1 is coupled between the gate terminal 24 and the second current terminal 30. During off-state operation, the M number of diodes along with FET gate-drain capacitances, the N−1 number of gate resistors, and the common gate resistor form a diode clamping circuit that actively generates additional negative gate bias voltages as the RF power level of the RF signal is increased.

A first control signal source 34 has a first switch control terminal 36 that in the general embodiment of FIG. 1 is coupled directly to the second current terminal 30 of the bias transistor Q0. The first control signal source 34 provides a first control signal VC through the first switch control terminal 36. Further still, a second control signal source 38 has a second switch control terminal 40 that is communicatively coupled to the bias gate terminal 28. The second control signal source 38 provides a second control signal VC that is at an opposite logic level of the first control signal VC.

In the general embodiment of FIG. 1, a bias control circuit 42 has a bias control output terminal 44 that is coupled to the bias gate terminal 28 through a bias gate resistor R2. The bias control circuit 42 includes a first bias control resistor R3 and a first bias control diode DS1 that are coupled in series between the first switch control terminal 36 and the bias control output terminal 44. A second bias control resistor R4 and a second bias control diode DS2 are coupled in series between the second switch control terminal 40 and the bias control output terminal 44. In the general embodiment of FIG. 1, the cathodes of the first bias control diode DS1 and the second bias control diode DS2 are coupled to the first switch control terminal 36 and the second switch control terminal 40, respectively. However, it is to be understood that the order in which the first bias control resistor R3 and the first bias control diode DS1 are coupled in series and the order in which the second bias control resistor R4 and the second bias control diode DS2 are coupled in series may be different in other embodiments. As such, the cathodes of the first bias control diode DS1 and the second bias control diode DS2 may be communicatively coupled to the first switch control terminal 36 and the second switch control terminal 40, respectively, as opposed to being directly coupled as shown in FIG. 1.

In at least some embodiments, feedback capacitors C1, C2, C3 and C(N−1) depicted in FIG. 1 are coupled between drain/source terminals 46 to the gate terminals 18 of individual ones of the N number of transistors 12. For example, the feedback capacitor C1 is coupled between the gate terminal 18 of the first FET Q1 and the drain/source terminal 46 shared by the first FET Q1 and the second FET Q2. The addition of the feedback capacitors C1 through C(N−1) provides feedback that increases symmetry of gate-to-source and gate-to-drain voltages of the N number of transistors 12.

Moreover, peripheries of select ones of the N number of transistors 12 may be scaled in relation to the Nth FET QN to also increase or further increase waveform symmetry of gate-to-source and gate-to-drain voltages of the N number of transistors 12. In this disclosure, periphery of a transistor is defined as a linear dimension of gate width of the transistor. For example, as depicted in FIG. 1, a periphery $W_Q$ of the Nth FET QN is equal to W while remaining ones of the N number of transistors 12 may each have reduced periphery that is scaled by an asymmetry parameter α, which in some embodiments ranges between 0.5 and 1. The reduced periphery may be different for each of the remaining ones of the N number of transistors 12. For example, individual peripheries of the first FET Q1, the second FET Q2, and the third FET Q3 are $W_{Q1}=\alpha_1 W$, $W_{Q2}=\alpha_2 W$, and $W_{Q3}=\alpha_3 W$, respectively, wherein W is the full scale periphery of the Nth FET QN. To maximize waveform symmetry, individual capacitance values of each or select ones of the feedback capacitors C1 through C(N−1) and the asymmetry parameter for each or select ones of the remaining ones of the N number of transistors 12 relative to the full scale periphery W may be adjusted by way of circuit simulation prior to fabrication. In at least some embodiments, capacitance values of individual ones of the feedback capacitors are between 1 femtofarad and 1 picofarad, and peripheries may be scaled between 1% and 10% relative to peripheries of adjacent ones of the N number of transistors. In other embodiments, peripheries may be scaled between 10% and 30% relative to peripheries of adjacent ones of the N number of transistors. In yet other embodiments, peripheries may be scaled between 30% and 60% relative to peripheries of adjacent ones of the N number of transistors.

Figure 2:
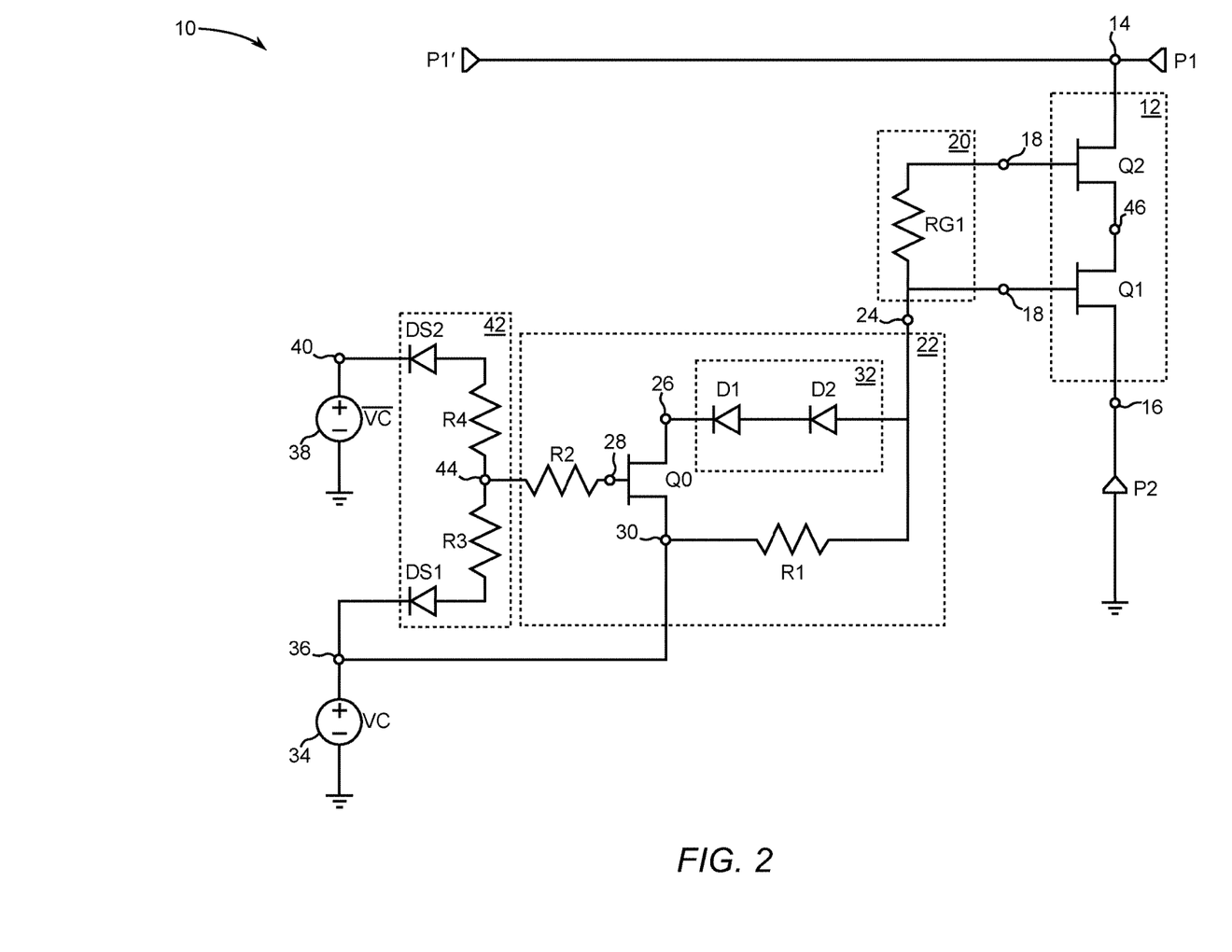
FIG. 2 is a schematic of a first specific embodiment of switch circuitry that includes a series stack of two transistors without feedback capacitors in accordance with the present disclosure.

FIG. 2 is a schematic of a first exemplary embodiment of switch circuitry 10 that includes a series stack of two transistors 12 without feedback capacitors. As depicted in FIG. 2, this first exemplary embodiment of switch circuitry 10 is a version of the general embodiment of FIG. 1. In this case N is equal to two. Therefore, in this case the Nth FET is the second FET Q2, and the series string of gate resistors 20 is reduced to just the first gate resistor RG1. Notice also that in this exemplary case, the second port P2 is grounded to implement a shunt switch branch usable in radio frequency switches that employ both series and shunt switch branches. In such a case, either the first port P1 or an additional port P1' would couple to a series switch branch, which is not shown.

Coincidentally, M is also equal to two, so the series string of bias diodes 32 is reduced to the first diode D1 and the second diode D2. Other than that difference, the remaining elements and configurations of the bias circuit 22 and the bias control circuit 42 remain the same as the general embodiment of FIG. 1.

Figure 3:
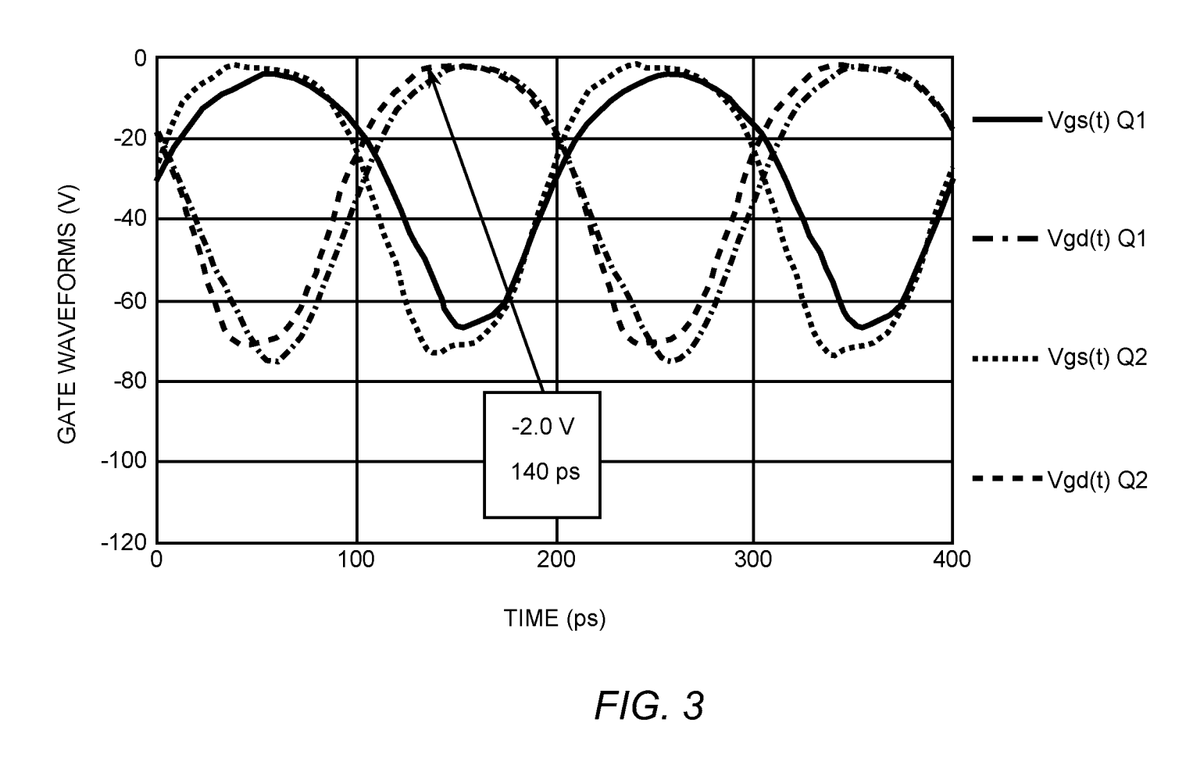
FIG. 3 is a graph of gate waveforms generated by the first exemplary embodiment depicted in FIG. 2.

FIG. 3 is a graph of gate waveforms developed during off-state operation of the first exemplary embodiment of the switch circuitry 10 as depicted in FIG. 2. The gate waveforms include gate-to-source voltage Vgs(t) depicted in solid line for the first FET Q1, gate-to-drain voltage Vgd(t) depicted in dash-dot line for the first FET Q1, Vgs(t) depicted in short dash line for the second FET Q2, and Vgd(t) depicted in long dash line for the second FET Q2. The gate waveforms were generated when the first control signal VC was set to a negative voltage below the threshold voltage of the first FET Q1 and the second FET Q2, and while the second control signal voltage $\overline{VC}$ was set to a positive voltage above the threshold voltage of the bias control transistor Q0. As such, the first FET Q1 and the second FET Q2 were set to their off-state.

A sinusoidal-shaped radio frequency signal applied to the first port P1 results in the gate waveforms of FIG. 3 while the first FET Q1 and the second FET Q2 are in their off-state. An advantage of the first exemplary embodiment in comparison to baseline switch circuitry (i.e., traditional switch circuitry) is that peak-to-peak voltages of gate waveforms are substantially equal, which increases voltage handling of the series stack transistors 12. On the other hand, each of the gate waveforms of FIG. 3 has a peak voltage of −2 V that is greater than the pinch-off voltage of the first FET Q1 and the second FET Q2, which is about −2.5 V. As a result, the first FET Q1 and the second FET Q2 will turn on at instances when the gate voltage waveforms exceed the pinch-off voltage of −2.5 V despite the first control signal being maintained at an off-state voltage level. As a result, insertion loss due to compression remains larger than desired with regard to the first exemplary embodiment. However, including the feedback capacitor C1 substantially lowers the peak voltage of the gate waveforms to less than the pinch-off, which prevents the first FET Q1 and the second FET Q2 from turning on while the first control signal VC is maintained at the off-state voltage level.

Figure 4:
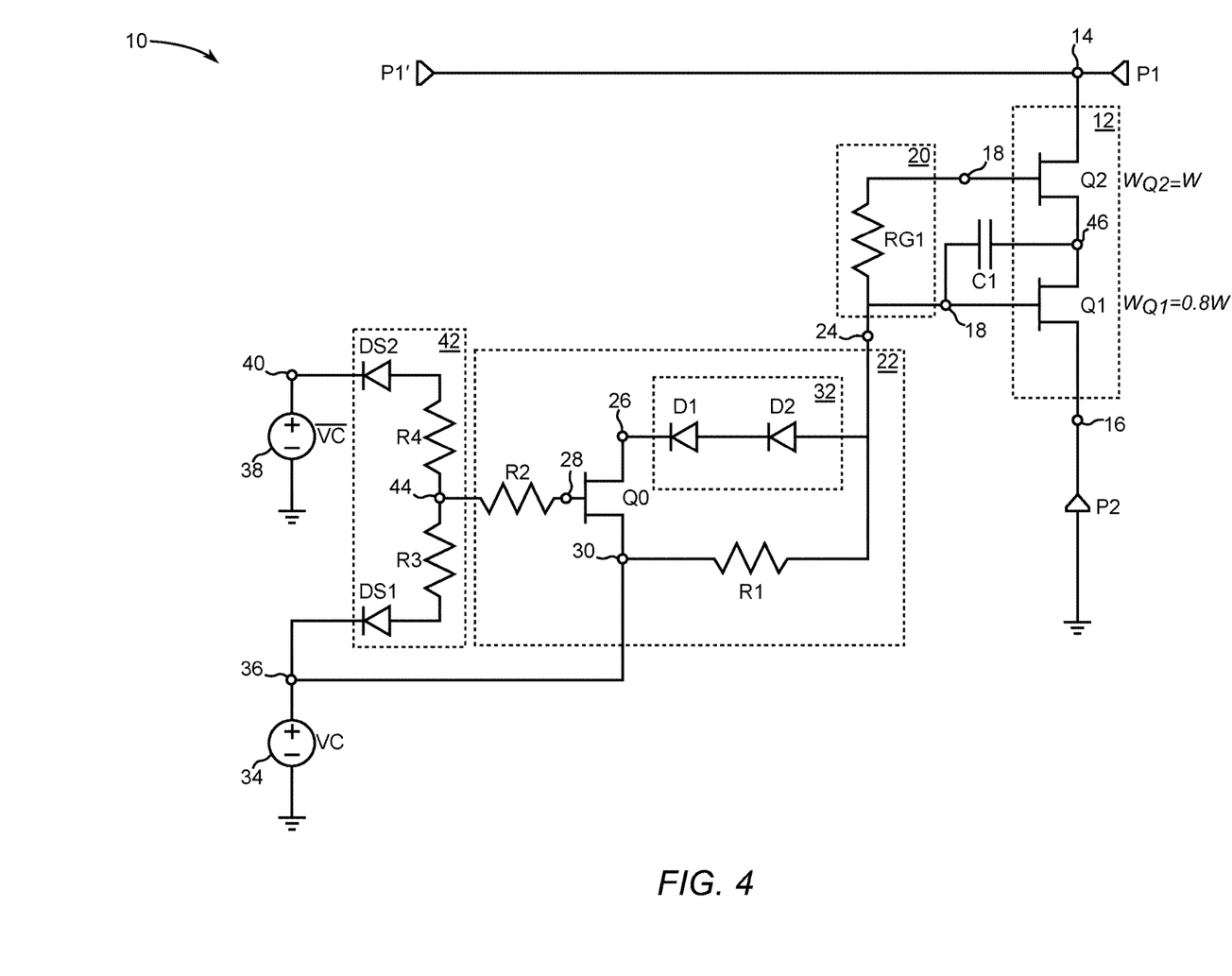
FIG. 4 is a schematic of a second exemplary embodiment of switch circuitry that includes a series stack of two transistors that includes at least one feedback capacitor in accordance with the present disclosure.

In this regard, FIG. 4 provides a schematic of a second exemplary embodiment of switch circuitry 10 that is identical in structure to the first exemplary embodiment with the exception of the inclusion of the feedback capacitor C1. In this second embodiment, the feedback capacitor C1 is coupled between the gate terminal 18 of the first FET Q1 and the drain/source terminal 46 shared by the first FET Q1 and the second FET Q2. Moreover, the periphery $W_{Q1}$ of the first FET Q1 is scaled to 80% of the periphery $W_{Q2}$ of the second FET Q2. In other words, the asymmetry parameter α is 0.8. The combined enhancements of providing the feedback capacitor C1 and reducing the periphery $W_{Q1}$ of the first FET Q1 relative to the periphery $W_{Q2}$ of the second FET Q2 provides gate waveforms that have substantially improved symmetry, which reduces harmonic distortion.

Figure 5:
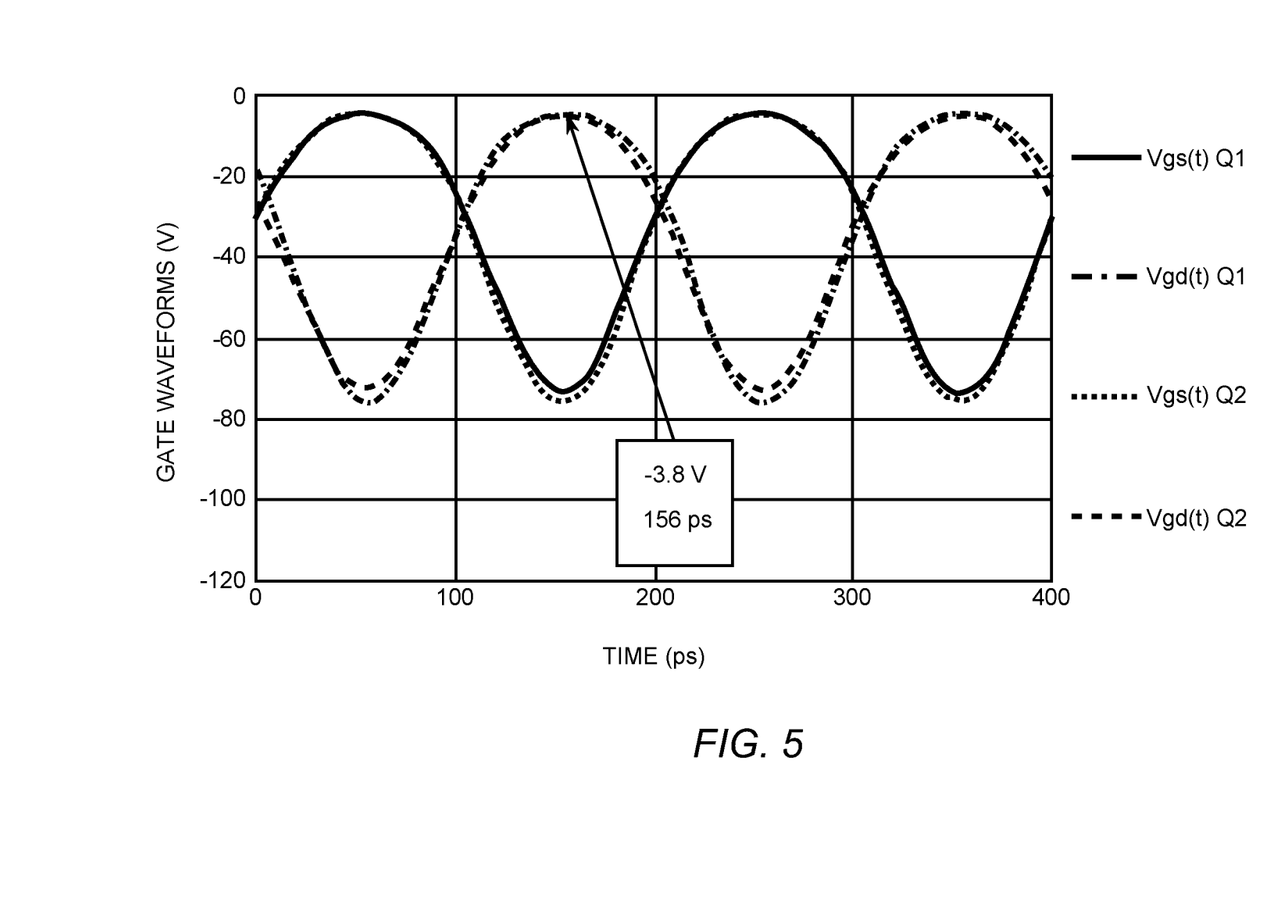
FIG. 5 is a graph of gate waveforms generated by the second exemplary embodiment depicted in FIG. 4.

In this regard FIG. 5 is a graph of gate waveforms generated by the second exemplary embodiment of the switch circuitry 10 depicted in FIG. 4. Notice that the peak voltage of the gate waveforms has dropped to −3.8 V, which is −1.3 V lower than the pinch-off voltage of −2.5 V. As a result, the first FET Q1 and the second FET Q2 remain in the desired off-state while the first control signal VC is maintained at the off-state voltage level. Moreover, the symmetry of the gate waveforms developed during off-state operation of the second embodiment of the switch circuitry 10 depicted in FIG. 4 is increased compared with the gate waveforms developed during off-state operation of the first exemplary embodiment of the switch circuitry 10 depicted in FIG. 2.

Figure 6:
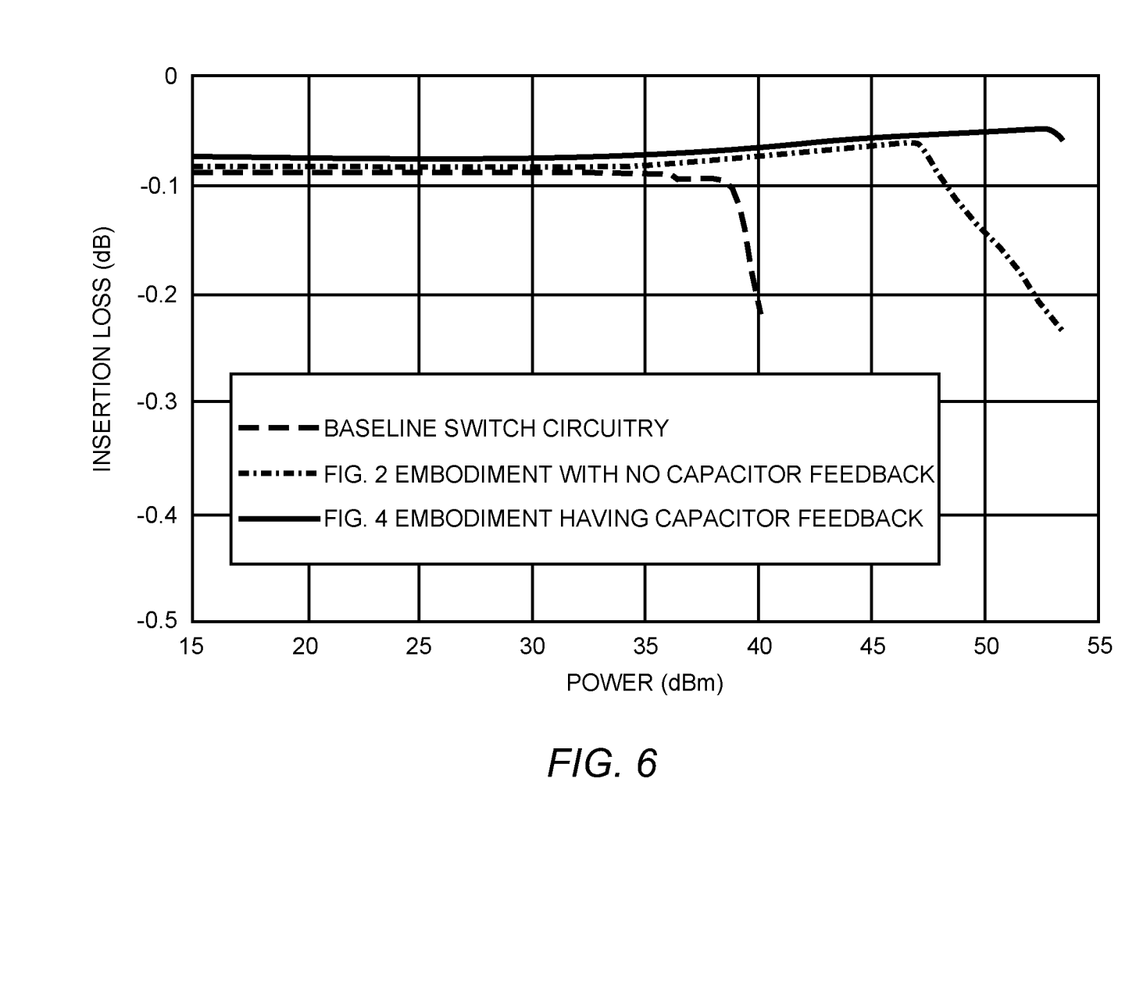
FIG. 6 is a graph of compression characteristics comparing insertion loss of baseline switch circuitry with insertion loss of the first exemplary embodiment of FIG. 2 and the insertion loss of the second exemplary embodiment of FIG. 4.

FIG. 6 is a graph of compression characteristics comparing insertion loss of baseline switch circuitry with insertion loss of the first exemplary embodiment of FIG. 2 and the insertion loss of the second exemplary embodiment of FIG. 4. Notice from the graph that baseline switch circuitry that does not include any of the bias circuit 22 (FIGS. 2 and 4), the bias control circuit 42, the feedback capacitor C1, or the asymmetry parameter α begins a relative steep increase in insertion loss as power of an applied radio frequency signal approaches 40 dBm. In contrast, the first exemplary embodiment of the switch circuitry 10 depicted in FIG. 2 has a slight decrease in insertion loss until the power of the applied radio frequency signal reaches 47 dBm. Even then, the steepness of the insertion loss associated with the first embodiment is shallower than that attributed to the baseline circuitry. The second exemplary embodiment of the switch circuitry 10 depicted in FIG. 4 provides an even slightly larger decrease in insertion loss until the power of the applied radio frequency signal reaches 53 dBm. Thus, the second exemplary embodiment of the switch circuitry 10 of FIG. 4 provides at least an additional 13 dBm of power range for a radio frequency signal applied to port P1. However, it is to be understood that loss and power handling is a function of many factors, including technology, frequency range, substrate loss, and control voltage. As such, embodiments of the switch circuitry 10 designed for operation at 50 GHz will have substantially different insertion loss and power handling than illustrated by the exemplary test data depicted in FIG. 6. Thus, embodiments of switch circuitry 10 that are designed to operate at various other frequencies that are higher and lower than the exemplary frequencies are within the scope of the present disclosure.

Those skilled in the art will recognize improvements and modifications to the preferred embodiments of the present disclosure. All such improvements and modifications are considered within the scope of the concepts disclosed herein and the claims that follow.

What is claimed is:

1. Switch circuitry comprising:
   a series stack of an N-number of transistors, wherein an Nth one of the N number of transistors has a drain terminal coupled to a first port terminal and a first one of the N number of transistors has a source terminal coupled to a second port terminal such that a radio frequency (RF) signal is passed between the first port terminal and the second port terminal when an on-state control voltage is applied to gate terminals of the N number of transistors and the RF signal is blocked from passing between the first port terminal and the second port terminal when an off-state control voltage is applied to the gate terminals, where N is a positive integer greater than one;
   a series string of an N−1 number of gate resistors having a common gate terminal, wherein each of the N−1 number of gate resistors is coupled between the gate terminals of adjacent ones of the N number of transistors;
   a bias control transistor having a bias control terminal, a first current terminal, and a second current terminal coupled to a first switch control terminal configured to receive the on-state control voltage and the off-state control voltage;
   an M number of diodes arranged and coupled between the common gate terminal and the first current terminal to rectify the RF signal and thereby apply additional voltage to the gate terminals, where M is a positive integer greater than zero; and
   at least and no more than an N−1 number of feedback capacitors coupled directly between common drain/source terminals of adjacent ones of the N number of transistors to the gate terminals of individual ones of the N number of transistors, wherein none of the N−1 number of feedback capacitors are coupled directly to either of the first port terminal or the second port terminal when the off-state control voltage is applied to the gate terminals, and a device periphery of individual ones of the series stack of the N number of transistors is scaled from 1% to 60% relative to the device peripheries of adjacent ones of the N number of transistors and capacitance values of individual ones of the feedback capacitors are scaled relative to the peripheries of adjacent ones of the N number of transistors to maximize symmetry of gate-to-source voltages and gate-to-drain voltages of the N number of transistors when the off-state control voltage is applied to the common gate terminal.

2. The switch circuitry of claim 1 further including a common gate resistor coupled between the common gate terminal and the first switch control terminal to convey the on-state control voltage and the off-state control voltage to the gate terminals of the N number of transistors.

3. The switch circuitry of claim 1 wherein capacitance values of individual ones of the at least and no more than N−1 number of feedback capacitors are between 1 femtofarad and 1 picofarad.

4. The switch circuitry of claim 1 further including a bias control circuit coupled to the bias control terminal of the bias control transistor, wherein the bias control circuit is configured to selectively cause a constant bias voltage to be generated at the common gate terminal in response to a first control signal and a second control signal that is complementary to the first control signal.

5. The switch circuitry of claim 4 wherein the bias control circuit comprises:
   a first control resistor and a first control diode communicatively coupled in series between the bias control terminal and the first switch control terminal through which the first control signal is received; and
   a second control resistor and a second control diode communicatively coupled in series between the bias control terminal and a second switch control terminal through which the second control signal is received.

6. The switch circuitry of claim 1 wherein the device periphery of individual ones of the series stack of the N number of transistors is scaled from 10% to 50% relative to the device peripheries of adjacent ones of the N number of transistors.

7. The switch circuitry of claim 1 wherein the device periphery of individual ones of the series stack of the N number of transistors is scaled from 1% to 10% relative to the device peripheries of adjacent ones of the N number of transistors.

8. The switch circuitry of claim 1 wherein the device periphery of individual ones of the series stack of the N number of transistors is scaled from 10% to 30% relative to the device peripheries of adjacent ones of the N number of transistors.

9. The switch circuitry of claim 1 wherein the device periphery of individual ones of the series stack of the N number of transistors may be scaled from 30% to 50% relative to the device peripheries of adjacent ones of the N number of transistors.

10. The switch circuitry of claim 1 wherein the series stack of the N-number of transistors comprises gallium nitride field-effect transistors.

11. The switch circuitry of claim 1 wherein the series stack of the N-number of transistors comprises gallium arsenide field-effect transistors.

12. The switch circuitry of claim 1 wherein the series stack of the N-number of transistors comprises silicon-on-insulator field-effect transistors.

13. The switch circuitry of claim 1 wherein insertion loss between the first port terminal and the second port terminal is between −0.05 dB and −0.1 dB for an RF signal power of between 40 dBm and 46 dBm.

14. The switch circuitry of claim 1 wherein insertion loss between the first port terminal and the second port terminal is between −0.05 dB and −0.1 dB for an RF signal power of between 40 dBm and 55 dBm.

15. The switch circuitry of claim 1 wherein gate-to-source waveforms of the N number of transistors have peak-to-peak voltages that are between 1% and 5% of each other when the RF signal is applied to either of the first port terminal or the second port terminal when the series stack of the N-number of transistors is in an off-state.

16. The switch circuitry of claim 1 wherein none of the series string of an N−1 number of gate resistors are capacitively coupled by the N−1 number of feedback capacitors to either of the first port terminal or the second port terminal when the off-state control voltage is applied to the gate terminals.

* * * * *

UNITED STATES PATENT AND TRADEMARK OFFICE
CERTIFICATE OF CORRECTION

PATENT NO. : 11,575,373 B2
APPLICATION NO. : 16/213185
DATED : February 7, 2023
INVENTOR(S) : Charles Forrest Campbell It is certified that error appears in the above-identified patent and that said Letters Patent is hereby corrected as shown below:

In the Specification

Column 3, Lines 51-52, replace "a first field-effect transistor (FET) 01" with --a first field-effect transistor (FET) Q1--.
Column 4, Lines 11-12, replace "the adjacent FETs 01 and Q2" with --the adjacent FETs Q1 and Q2--.
Column 4, Line 50, replace "a second control signal VC" with --a second control signal $\overline{VC}$--.

Signed and Sealed this
Twenty-first Day of March, 2023

*Katherine Kelly Vidal*

Katherine Kelly Vidal
*Director of the United States Patent and Trademark Office*